United States Patent [19]

Dabosi et al.

[11] Patent Number: 4,980,203
[45] Date of Patent: Dec. 25, 1990

[54] PROCESS FOR PRODUCING A PROTECTIVE FILM ON MAGNESIUM CONTAINING SUBSTRATES BY CHEMICAL VAPOR DEPOSITION OF TWO OR MORE LAYERS

[75] Inventors: Francis, J. P. Dabosi, Ramonville Saint Agne; Roland Morancho; Dominique Pouteau, both of Toulouse, all of France

[73] Assignee: Centre de Recherche et de Promotion du Magnesium (CEPROMAG), Decazeville, France

[21] Appl. No.: 375,532

[22] Filed: Jul. 3, 1989

[30] Foreign Application Priority Data

Jul. 1, 1988 [FR] France .................. 88 09050

[51] Int. Cl.$^5$ .................. C23C 16/12; C23C 16/40; C23C 16/46; C23C 16/56
[52] U.S. Cl. .................. 427/252; 427/250; 427/255.3; 427/255.7; 427/353; 427/405; 427/419.2
[58] Field of Search .................. 427/252, 248.1, 255.3, 427/255.7, 353, 405, 419.2, 124

[56] References Cited

U.S. PATENT DOCUMENTS

| | | | |
|---|---|---|---|
| 2,784,486 | 3/1957 | Langer et al. | 427/419.2 |
| 2,847,320 | 8/1958 | Bulloff | 427/252 |
| 2,867,546 | 1/1959 | MacNevin | 427/252 |
| 2,982,016 | 5/1961 | Drummond | 427/252 |
| 4,395,437 | 7/1983 | Knapp | 427/405 |
| 4,659,629 | 4/1987 | Gartner et al. | 427/419.2 |

Primary Examiner—Norman Morgenstern
Assistant Examiner—Margaret Bueker
Attorney, Agent, or Firm—Harold H. Dutton, Jr.

[57] ABSTRACT

A process for producing a protective film on a magnesium based metallic substrate comprising producing successive deposits by vapor phase chemical deposition of at least one intermediate layer of metallic aluminum, and at least one surface layer of metallic oxide, and for the intermediate aluminum layer using a precursor chosen of triisobutylaluminum, heating the substrate to a temperature between 250° C. and 320° C., and for the surface layer selecting an appropriate precursor, heating the substrate to an appropriate temperature and introducing the precursor vapor to produce a protective film having a high surface hardness and strong adherence to the magnesium based substrate with high inertness in the electrochemical series, and forming an effective protection under both static and dynamic conditions.

11 Claims, 3 Drawing Sheets

PROCESS FOR PRODUCING A PROTECTIVE FILM ON MAGNESIUM CONTAINING SUBSTRATES BY CHEMICAL VAPOR DEPOSITION OF TWO OR MORE LAYERS

This invention relates to a process for producing a protective film on a magnesium based metal substrate. More particularly, the invention relates to applications of the process for protecting most of the magnesium alloys commonly used in industry. The invention also relates to a magnesium based substrate, coated with a protective film produced by the process of the invention.

BACKGROUND AND OBJECTS OF THE INVENTION

Magnesium is a metal having very specific properties, and which is used in an increasing number of applications (in general in the form of alloys, particularly GA9, GA9Z$_1$, MSR and RZ5 alloys), such properties being, for example, a favorable ratio of density to mechanical properties, ease of working, the property of damping vibrations, creep characteristics at average temperatures.

However, magnesium is the most active metal in the electrochemical series (standard electrode potential of $-2.3$ volts with respect to a standard hydrogen electrode at ambient temperature) and is therefor very sensitive to corrosion.

The techniques presently used for coating a magnesium based substrate with a protective layer are essentially as follows: anodization in a fluorine containing bath followed by a chromating, chemical mordanting followed by impregnation with polymers and electrodeposition of paints or varnishes. These protection techniques are effective under static conditions, that is in the absence of stressing of the surface of the substrate. By contrast, under dynamic conditions (friction, dynamic working, etc.) these protections are scratched off or are abraded, and very quickly allow the substrate to appear. Moreover, the known chromating treatments use toxic baths which lead to pollution problems which are not readily overcome at the present time.

A technique is also known for metallizing a magnesium substrate by electrolytically depositing aluminum. However, this technique leads to a poorly compacted layer of aluminum which does make the surface of the substrate less active, but which does not produce a very effective protection. Also, this layer is poorly adherent and therefor, as in the case of other coatings mentioned above, is not very effective under dynamic conditions.

Japanese patent No. A-61,190,078 proposes a process for protecting magnesium consisting of carrying out a metallization of aluminum in a vacuum on the substrate, followed by a treatment by means of a chromatizing bath. In an analogous manner, French patent No. 2,589,485 describes a magnesium treating process consisting of carrying out an ionic plating with aluminum, followed by a chromating treatment in a bath. However, in these documents, the chromating treatment is not explained in any detail, such that it is not possible to know the performance of the coatings obtained, particularly under dynamic conditions. Moreover, these protective processes, using baths of chromium salts, are subject to the same disadvantages of toxicity and pollution mentioned above.

The present invention proposes to provide a satisfactory solution to the technical problems mentioned above, for protecting a magnesium based substrate.

An essential object of the invention is to provide on the substrate a protective film which is perfectly inert in the electrochemical series so as to eliminate any risk of corrosion.

Another object is to provide a protective film of very high surface hardness, adhering very strongly to the substrate, in such a manner as to constitute an effective protection, not only under static conditions, but also under dynamic conditions (working, friction, shocks, etc.)

Another object is to permit the protection of substrates having complex surfaces by a continuous protective film.

Another object is to permit easy adjustment of the thickness of the protective film as a function of the application.

Another object is to avoid the use of toxic baths which lead to disposal and/or pollution problems.

DESCRIPTION OF THE INVENTION

To this end, the process according to the invention for producing a protective film on a metallic, magnesium based substrate comprises depositing successively by chemical vapor deposition (CVD) at least two layers, one referred to as the intermediate layer of metallic aluminum, and the second layer, superimposed on the intermediate layer, formed of a metallic oxide selected from the following group: titanium oxide, aluminum oxide, zirconium oxide, chromium oxide, and silicon oxide. The depositions are carried out by selecting an aluminum precursor and a metal oxide precursor which are able to decompose at temperatures less than 430° C., bringing the substrate to the decomposition temperature of the aluminum precursor, bringing the aluminum precursor in the vapor phase into contact with the substrate so as to deposit the aluminum layer, and then after deposition of the intermediate layer, bringing the substrate to the decomposition temperature of the metallic oxide precursor and bringing said metallic oxide precursor in the vapor phase into contact with the substrate so as to deposit the metal oxide layer on the aluminum layer.

Experiments have shown that such a process produces a protective film which is extremely effective with regard to corrosion, and benefits from a remarkable cohesion between the layers and an excellent anchoring of the film on the substrate. In particular such a film resists in a completely satisfactory manner dynamic stress conditions without lifting off or deteriorating.

This remarkable cohesion and linking of the film to the substrate seems to come from the successive depositing steps of the layers by CVD. This technique produces in the vicinity of the surface of the substrate nascent species of compounds, and the deposition of these species in the native state is accompanied by a superficial diffusion of metals present (magnesium, aluminum), first at the interface of the substrate and intermediate aluminum layer, and secondly of aluminum and the oxide present at the interface of the two layers of the film. The function of the intermediate layer is thus to serve as an anchoring layer for the oxide layer. Since it is produced from a metal having a coefficient of expansion identical to that of magnesium, the coating avoids thermal constraints which would cause the appearance of a separation of the protective film. The oxide layer is hard and inert in the electrochemical series, such that it comprises an excellent protective film.

It should be noted that deposits by CVD may be assisted by plasma according to a process which itself is known. This plasma assistance is used in particular in the case where the oxide layer is silicon oxide, the precursor chosen being then tetraethoxysilane which decomposes at about 100° C. during CVD assisted by plasma.

In certain cases, several metallic intermediate layers and/or several metallic oxide layers may be provided in order to assure an optimum relaxation of constraints between layers.

According to one preferred embodiment, an oxide layer is formed of titanium oxide using a precursor (tetraisopropylorthotitanate: TIPOT) the decomposition of which occurs at 360° C., permitting a rapid growth of the deposit.

The intermediate layer of metallic aluminum is preferably obtained by CVD under the following conditions: a precursor of triisobutylaluminum (TIBA) is chosen, the precursor is brought to a temperature between about 10° C. and 60° C. to bring a fraction into the vapor phase. The substrate is then brought to a temperature between about 250° C. and 350° C., and the TIBA vapor is brought into contact with the substrate.

Preferably, this deposit of aluminum is carried out under a primary vacuum at a pressure less than 10 Pascals. This increases the diffusion of the gaseous species and a better uniformity of the deposit is obtained, regardless of the complexity of the surface of the substrate.

Further, the hardness of the deposit will in practice be adapted to produce a layer of aluminum having a thickness between about 0.1 and 2 microns. This thickness is well suited to obtain an anchoring layer of good effectiveness.

In the preferred case where the oxide layer is of titanium oxide, this is advantageously obtained by CVD under the following conditions: a precursor is selected of tetraisopropylorthotitanate (TIPOT), the precursor is heated to a temperature between about 30° C. and 60° C. to bring the precursor to a vapor phase, then the substrate is brought to a temperature of between about 360° C. and 430° C., and the TIPOT vapor is brought into contact with the heated substrate.

In a manner which is known in CVD technology, the TIBA vapor as well as the TIPOT vapor may be transported toward the substrate by means of a gas vector which is inert to the particular vapor used, at a reduced pressure between about 50 and 500 Pascals, which assures a good diffusion of the gaseous species regardless of the complexity of the substrate. For the TIBA vapor, high purity helium or high purity nitrogen may be used. For TIPOT vapor, these two gases may also be used along with oxygen in the gas, leading to a better stoichiometry of the deposit. The duration of the deposition will in practice be adjusted to produce a layer of titanium oxide of a thickness between about 1 and 5 microns. The choice of thickness in this range is selected as a function of the mechanical constraints to which the substrate will be subjected.

After formation of the titanium oxide layer, the substrate is cooled, preferably slowly to avoid a thermal shock (a speed of cooling of less than about 3°/min).

In the case of an outer layer of aluminum oxide, the precursor selected may be aluminum triisopropoxide which decomposes between 380° C. and 420° C. in conventional CVD. In the case of zirconium oxide, the precursor selected may be zirconium tetrapentadionate which decomposes between 300° C. and 430° C. in conventional CVD. In the case of chromium oxide, the precursor may be either chromecarbonyl which decomposes between 260° C. and 320° C. in conventional CVD, or dibenzenechromium which decomposes between 350° C. and 400° C.

In this latter case of a surface layer of chromium oxide, the process of the invention is preferably carried out in the manner described hereinafter which particularly enhances the hardness of the coating obtained. The chosen precursor is hexacarbonylchromium (which is brought to between 10° C. and 40° C. to bring a fraction to the vapor phase) and the precursor vapor is transported by a vector gas of helium which, after passage through the precursor is diluted with oxygen, the substrate having been brought to between 260° C. and 320° C. There is then obtained a layer of oxide which comprises a thickness of chromium carbide to increase the hardness.

The process of the invention may be applied for achieving a protective film on any magnesium based substrate, and in particular on the most commonly used alloys of magnesium: GA9 (Mg, 9% Al), GA9Z1 (Mg, 9% Al, 1% Zn), MSR (Mg, 2% rare earths, 2% Ag, 0.5% Zr), RZ5 (Mg, 4% Zn, 1% rare earth, 0.5% Zr).

To reduce the microscopic porosity of the coating, it is possible to immerse the coated substrate in a boiling aqueous bath for at least 30 minutes. A sealing of the surface is thus obtained.

The invention also relates to a new product, a magnesium based metal substrate coated with a protective film produced by the process described herein. The protective film is characterized in that it comprises at least two superimposed layers connected to each other, the layers being an intermediate layer of metallic aluminum, and the other layer being a metal oxide selected from the following group: titanium oxide, alumina, zirconium oxide, chromium oxide and silicone oxide with diffusion of the species at the aluminum/substrate and aluminum/metal oxide interfaces.

DESCRIPTION OF THE DRAWINGS

The description which follows with reference to the figures of the attached drawings illustrates examples of carrying out the process of the invention. In these drawings.

DESCRIPTION OF PREFERRED EMBODIMENTS

Figure 1:
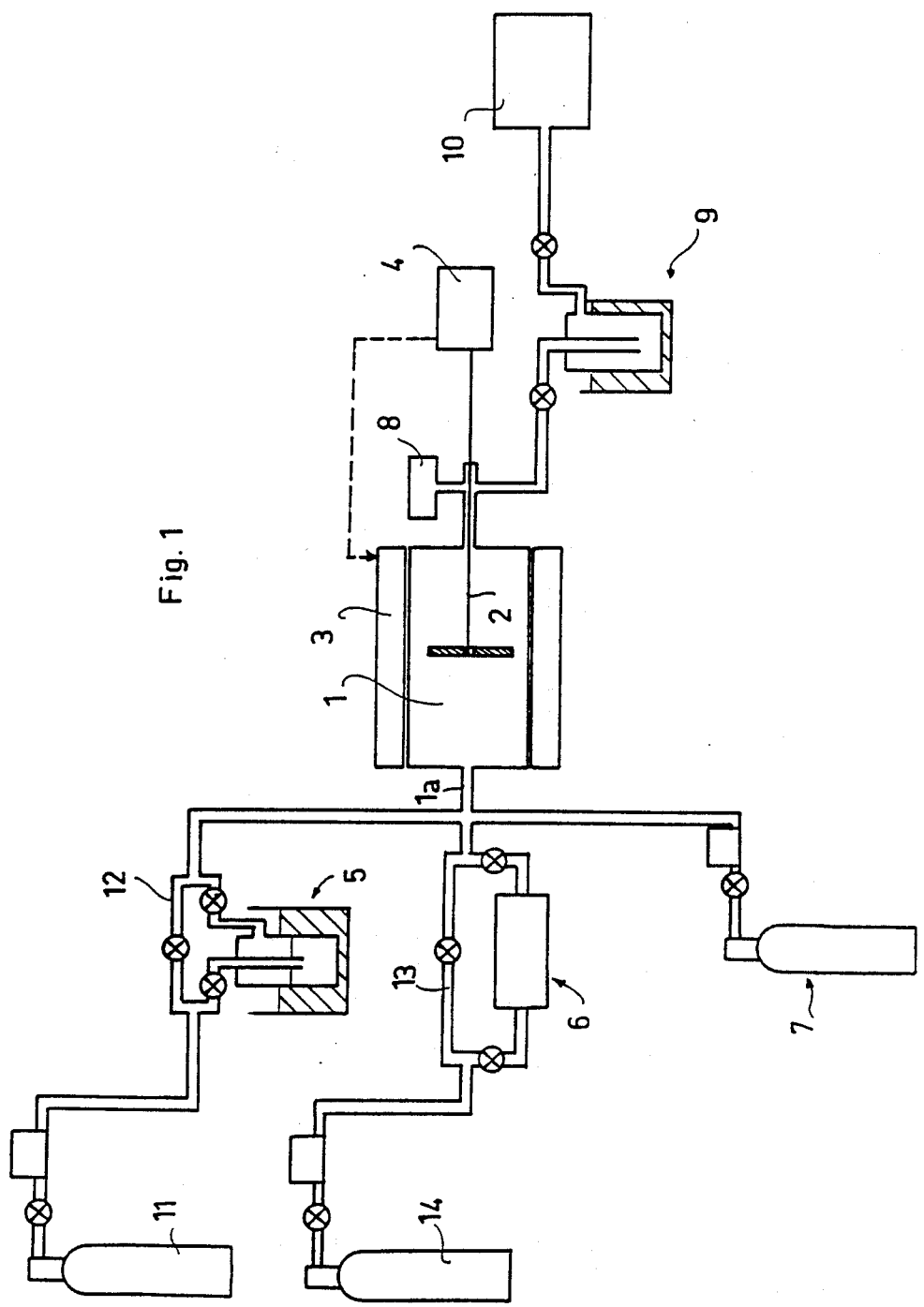
FIG. 1 is an schematic view of a CVD installation used for carrying out the examples.

The examples hereinafter seek to protect a substrate comprising a circular plate of GA9Z$_1$ alloy of 2mm thickness. This substrate is preliminarily polished, rinsed in an ultrasonic bath of alcohol, and then rinsed with acetone and dried with compressed air, in order to obtain a clean and well degreased surface.

The substrate thus prepared is placed in a CVD reactor 1. In the example, it is anchored in a vertical position to a thermocouple probe 2. In a conventional manner, the reactor is associated with thermostatically controlled resistance heaters 3, controlled by a temperature regulator 4 receiving the temperature information from the probe 2.

The inlet of the reactor is connected by conduits, one to a saturator 5 for TIBA (triisobutylaluminum), and the other to a generator 6 for the metal oxide precursor, and finally to a bottle 7 of dilution gas (oxygen).

The saturator 5 and the generator 6 receive respectively in the inlet a flow of either high purity nitrogen from a bottle 11, or helium from a bottle 14. Valves and mass flowmeters permit adjusting the flow of the composition sent to the reactor or to assure a sweeping of the selected gas across the diversion paths 12 or 13.

The outlet of the reactor 2 is connected to a pressure gauge 8 and a liquid nitrogen trap 9. A dynamic pump system 10 permits adjusting the pressure in the reactor 1.

In a preliminary step, the conduits are purged by a pump for a period of about one hour, to assure a primary vacuum of about 5 Pascals.

Nitrogen is then delivered by the diverter 12 in order to fill the reactor and the conduits, at a pressure of about 130 Pascals. The reactor is heated to 280° C.

Once this temperature is attained, a line from the saturator 5 is then caused to admit the TIBA vapors into the reactor 1. This saturator 5 contains TIBA liquid and is heated in a water bath to 45° C. It should be noted that the conduit connecting the saturator 5 and the reactor 1 is provided with a heating cord heated to 60° C. in order to avoid recondensation of the TIBA. The temperature of the reactor 1 and therefor that of the substrate is controlled at 280° C. This operation for depositing aluminum lasts for about 30 minutes.

At the end of this time, the saturator 5 is removed from the circuit, and nitrogen is delivered anew by the diversion 12 with a pressure in the reactor of about 130 Pascals, in order to deposit the layer of metallic oxide under the conditions given hereinafter.

EXAMPLE 1

Layer of Metallic Oxide Formed by Titanium Oxide

The reactor is heated to an elevated temperature of 380° C. Once the temperature has stabilized, the nitrogen is removed from the circuit and the line from the generator 6, whilution gas so that the pressure in the reactor 1 will be equal to 130 Pascals. This operation of depositing titanium oxide lasts for two hours.

At the end of this time, the generator 6 is removed from the circuit, the helium continuing to circulate through the diversion 13. The heating of the reactor is turned off so as to cause a slow cooling thereof. The pump system 10 is also turned off in order to slowly return to atmospheric pressure. At the end of about two hours, the reactor is at ambient temperature, and the helium bottle 14 and the oxygen bottle 7 are closed, and the substrate may be removed.

The following analyses were carried out on the substrate: analysis by a scanning electron microscope coupled to an X-ray energy scattering analyzer to identify the heavy elements present at the surface, X-ray analysis to characterize the composition present on the surface, transverse cross-sectioning with measurement of the thickness by electron microscope, analysis by "AUGER" electron spectroscopy of the concentration profile, analysis by E.S.C.A., Vickers hardness measurement, measurement of the electrochemical behavior by determination of the curves of intensity/potential in 0.5 M $Na_2SO_4$, and qualitative "Scotch" adherence testing.

These analyses and tests have provided the following results:

The total thickness of the coating is 4 microns (1.5 micron of aluminum and 2.5 microns of titanium dioxide).

The surface layer comprises $TiO_2$ in the anatase form.

The adherence test comprises scoring the layer in a grid pattern, adhering a piece of "Scotch" adhesive tape thereto, and removing the tape. No removal of the material was observed, which shows a good adherence of the material, both of the intermediate aluminum layer to the substrate, as well as the titanium oxide layer on the intermediate aluminum layer. The concentration profile obtained by AUGER spectroscopy is characteristic of a diffusion of the elements into the interfaces.

The initial hardness (Vickers) of the magnesium alloy was 70 kg/mm$^2$; after the coating, this hardness increased to 280 kg/mm$^2$.

Figure 2:
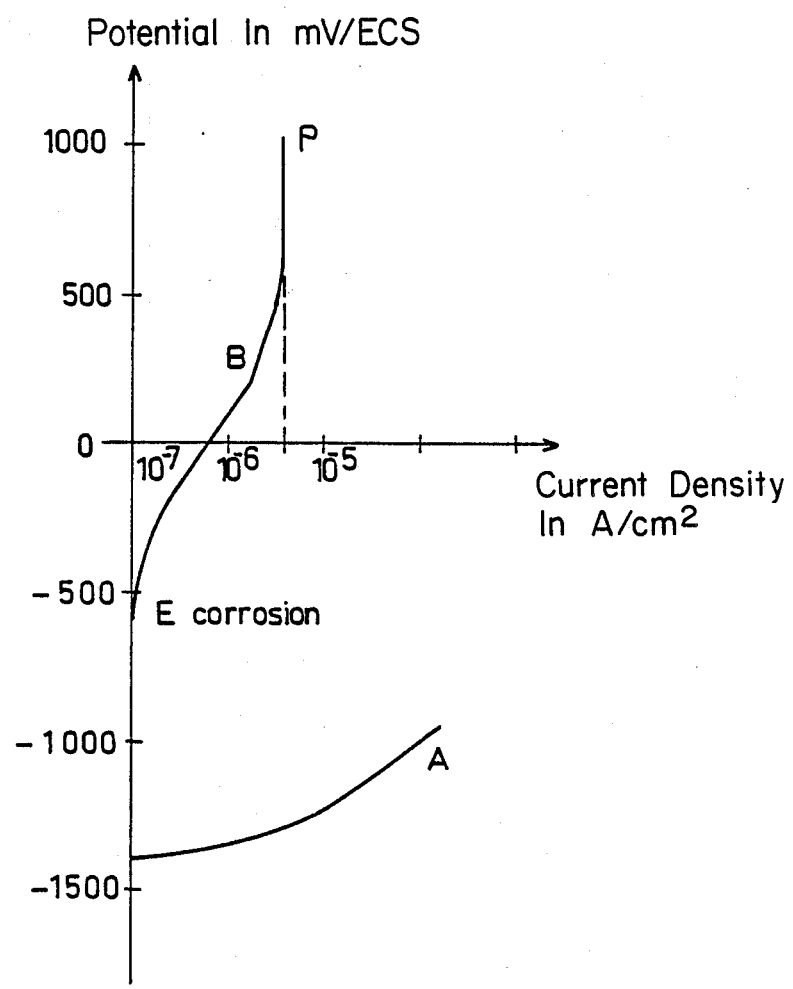
FIGS. 2 and 3 are comparative diagrams showing curves illustrating the electrochemical behavior of coated and uncoated substrates.

FIG. 2 shows the intensity/potential curve in $Na_2SO_4$ of the uncoated magnesium alloy (curve A) and of the alloy protected by the coating (curve B).

On the abscissa are shown the current densities in A/cm$^2$ and on the ordinate the potentials in millivolts with respect to the saturated calomel electrode.

It was verified that the coating lead to a very strong increase of the corrosion potential, with the appearance of levelling off of the passivity P for a density of approximately $6 \times 10^{-6}$ A/cm$^2$. Repeated experiments showed the good reproducibility of these results.

EXAMPLE 2

Layer of Metal Oxide Formed by Alumina

The operative conditions were analogous with those of Example 1, with the following differences:
reactor heated to 400° C.;
generator 6 formed by a crucible containing solid aluminum triisopropoxide heated by an oil bath to 120° C.;
surface layer of $Al_2O_3$ obtained;
total thickness of coating obtained: 2.5 microns (1.5 microns of aluminum and 1 micron of aluminum oxide);
adherence test: identical results as previously.

Figure 3:
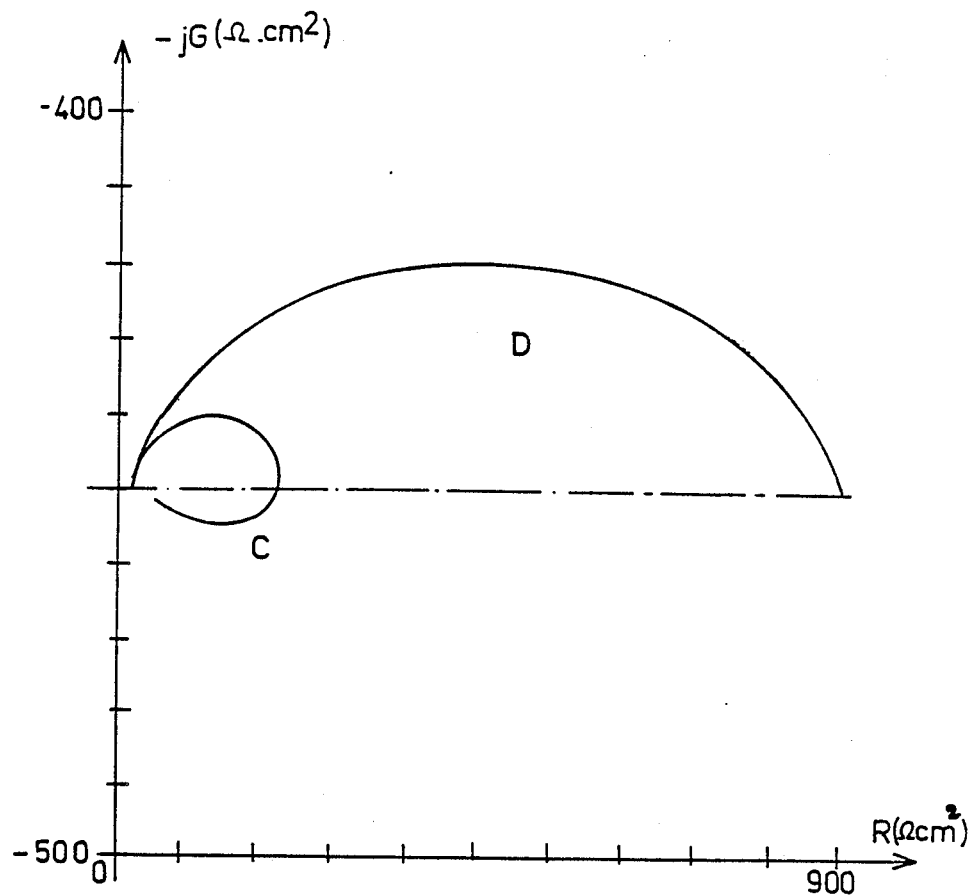

FIG. 3 shows a diagram of the electrochemical impedance on Nyquist coordinates in $Na_2SO_4$ medium of the uncoated magnesium alloy (curve C) and of the alloy protected by the coating of this example (curve D).

It was verified that the coating lead to a disappearance of the inductive loop corresponding to the corrosion phenomenon of magnesium, and an increase in the capacitive loop translating into an improved resistance to corrosion.

EXAMPLE 3

Layer of Metal Oxide Formed by Chromium Oxide

The operative conditions were analogous to those of Example 1, with the following differences:
reactor heated 300° C.;
generator 6 formed by a crucible containing solid chromium hexacarbonyl, at ambiant temperature of 20° C.;
duration of deposit: one hour;
surface layer obtained, characterized by a majority of $Cr_2O_3$ and $CrO_3$;

total thickness of coating obtained: 5 microns (1.5 microns of Al and 3.5 microns of chromium oxide);
Vickers hardness: 800 kg/mm$^2$;
adherence test: results identical to the preceding.

E.S.C.A. analysis revealed on the surface of the coating the presence of $Cr_2O_3$ and of $CrO_3$. X-ray analysis revealed the presence of chromium carbide in depth.

The electro-chemical impedance diagram on Nyquist coordinates in $Na_2SO_4$ medium of the magnesium alloy protected by the coating is the same as that obtained in the preceding example (FIG. 3, curve D).

As before, the coating leads to a disappearance of the inductive loop corresponding to the corrosion phenomenon of magnesium.

The high value of the Vickers hardness comes from the presence of the chromium carbide in the surface layer. It should be noted that, in an unexpected manner, this presence does not reduce the adherence of this layer on the intermediate aluminum layer.

EXAMPLE 4

The substrate coated in Example 1 is immersed in a bath of boiling water for about one hour. It was verified that the corrosion potential was shifted upwardly from a value on the order of 200 mV/ECS.

While this invention has been described as having certain preferred features and embodiments, it will be understood that it is capable of still further variation and modification without departing from the spirit of the invention, and this application is intended to cover any and all variations, modifications and adaptations of the invention as fall within the spirit of the invention and the scope of the appended claims.

We claim:

1. A process for producing a protective film on a predominantly magnesium metal substrate comprising carrying out successive chemical vapor phase depositions of at least two layers on said substrate, a first layer comprising an aluminum based intermediate layer, and a second layer superimposed on the first layer comprising a metal oxide selected from the group consisting of oxides of titanium, aluminum, zirconium, chromium and silicon, carrying out said depositions by providing an aluminum precursor and a metal oxide precursor able to decompose at temperatures below 430° C., bringing the substrate to the decomposition temperature of the aluminum precursor, bringing said precursor in the vapor phase into contact with said substrate, then after depositing the aluminum layer, bringing the substrate to the decomposition temperature of the metal oxide precursor and bringing said precursor in the vapor phase into contact with said substrate.

2. A process as in claim 1 and including transporting the vapors of said precursors to the substrate at reduced pressure by means of a vector gas inert with respect to said vapors.

3. A process as in claim 2, and including providing a precursor for said first layer comprising triisobutylaluminum (TIBA), bringing said precursor to a temperature between about 10° C. and 60° C. for bringing a fraction to the vapor phase, bringing the substrate to a temperature between about 250° C. and 350° C., and bringing the TIBA vapor into contact with said substrate.

4. A process as in claim 3 and including carrying out the vapor phase deposition of aluminum under a primary vacuum at a pressure lower than about 10 pascals.

5. A process as in claim 4 and including bringing the TIBA vapor into contact with the substrate for a period of time sufficient to bring about a deposit of an aluminum layer having a thickness between about 0.1 and 2 microns.

6. A process as in claim 2 and wherein said metal oxide comprises titanium oxide, wherein said metal oxide precursor comprises tetraisopropylorthotitanate (TIPOT), heating said metal oxide precursor to a temperature between about 30° C. and 60° C. for vaporizing a fraction of said metal oxide precursor, bringing the substrate to a temperature between 360° C. and 430° C., and contacting said substrate with the TIPOT vapor.

7. A process as in claim 6 and including bringing the TIPOT vapor into contact with the substrate for a period sufficient to produce a deposit of titanium oxide having a thickness between about 1 and 5 microns.

8. A process as in claim 6 and including slowly cooling the substrate after formation of said titanium oxide layer.

9. A process as in claim 2 and wherein said metal oxide layer comprises a surface layer of chromium oxide containing chromium carbide, wherein said metal oxide precursor comprises chromium hexacarbonyl, bringing said precursor to a temperature between about 10° C. and 40° C. for vaporizing a fraction of said precursor, transporting the vapor obtained by means of a gas vector comprising oxygen, bringing the substrate to a temperature between 260° C. and 320° C. and contacting said substrate with the gas vector and the vapor.

10. A process as in claim 1 and wherein said substrate comprises a magnesium alloy selected from the group consisting of GA9 (mg, 9% Al), GA9Z1 (mg, 9% Zn), MSR (Mg, 2% rare earths, 2% Ag, 0.5% Zr), RZ5 (Mg, 4% Zn, 1% rare earths, 0.5% Zr).

11. A process as in claim 10 and including carrying out a washing treatment on the coated substrate in a boiling aqueous solution.

* * * * *